(12) United States Patent
Stakem

(10) Patent No.: US 8,113,402 B2
(45) Date of Patent: Feb. 14, 2012

(54) FEED MECHANISM FOR A MACHINE

(75) Inventor: Kerry Joseph Stakem, Hummelstown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 386 days.

(21) Appl. No.: 12/277,830

(22) Filed: Nov. 25, 2008

(65) Prior Publication Data

US 2009/0140025 A1   Jun. 4, 2009

Related U.S. Application Data

(60) Provisional application No. 61/004,649, filed on Nov. 29, 2007.

(51) Int. Cl.
*B65H 51/00* (2006.01)
(52) U.S. Cl. .......................... 226/68; 226/164
(58) Field of Classification Search .............. 226/6, 62, 226/63, 67, 68, 71, 115–117, 164, 166
See application file for complete search history.

(56) References Cited

U.S. PATENT DOCUMENTS

| | | | | |
|---|---|---|---|---|
| 298,204 | A | * | 5/1884 | Hill .................. 140/60 |
| 699,508 | A | * | 5/1902 | Fehr ................. 226/164 |
| 846,589 | A | * | 3/1907 | Marsh ............... 140/75 |
| 911,911 | A | * | 2/1909 | Sisson ............... 72/71 |
| 1,028,523 | A | * | 6/1912 | Anderson .......... 414/431 |
| 2,518,172 | A | * | 8/1950 | Packer .............. 226/164 |
| 2,598,041 | A | * | 5/1952 | Dousa .............. 226/164 |
| 3,026,010 | A | | 3/1962 | Crosby et al. |
| 3,642,186 | A | * | 2/1972 | Nemeth et al. ........ 226/164 |
| 4,166,316 | A | | 9/1979 | Misawa et al. |
| 4,318,964 | A | | 3/1982 | Zahn et al. |
| 5,887,340 | A | | 3/1999 | Bair |
| 6,367,148 | B1 | | 4/2002 | Caveney et al. |
| 6,405,915 | B1 | | 6/2002 | Backenstoes et al. |
| 6,416,040 | B1 | | 7/2002 | Bergman |
| 6,601,290 | B2 | | 8/2003 | Stakem |
| 6,691,859 | B2 | | 2/2004 | Weber |

FOREIGN PATENT DOCUMENTS

GB   1 551 040   8/1979

OTHER PUBLICATIONS

International Search Report; International Application No. PCT/US2008/013171; International Filing Date Nov. 26, 2008.

* cited by examiner

*Primary Examiner* — Michael Mansen
*Assistant Examiner* — Scott Haugland

(57) ABSTRACT

A feed mechanism includes a feed slide movable between a retracted position and an advanced position. The feed slide is configured to feed a product strip during a feed stroke as the feed slide is moved from the retracted position to the advanced position and the feed slide is movable with respect to the product strip during a return stroke as the feed slide is moved from the advanced position to the retracted position. The feed mechanism also includes feed fingers pivotally coupled to the feed slide at corresponding attachment points. The feed fingers are movable between an engaged position and a released position, wherein the feed fingers are configured to contact the product strip in the engaged position and the feed fingers are configured to be positioned away from the product strip in the released position. The feed fingers are moved to the released position prior to the feed slide moving along the return stroke.

19 Claims, 8 Drawing Sheets

FEED MECHANISM FOR A MACHINE

CROSS REFERENCE TO RELATED APPLICATIONS

This application claims the benefit of U.S. Provisional Application No. 61/004,649 filed Nov. 29, 2007, the subject matter of which is herein incorporated by reference in its entirety.

BACKGROUND OF THE INVENTION

The subject matter herein relates generally to a machine for receiving elongated products mutually attached end to end to form a continuous string of products and performing a manufacturing operation with one or more of the individual products, and more particularly, to a feed mechanism for incrementally feeding the string of products.

Machines for handling continuous strips of elongated products that are mutually attached end to end must be able to intermittently engage and advance each individual product into precise alignment for performing some manufacturing operation without regard to tolerance buildup caused by dimensional variations of the individual pieces of the strip. Typical examples of elongated products that are mutually attached end to end are square wire pins and round wire pins. For example, current products are formed as a strip of individual elongated, adjacent pins which are interconnected or attached end to end at indentations. In one embodiment, the strip of pins is made of square wire so that the pins have a square cross section. In another embodiment, the strip of pins is made of round wire so that the pins have a round cross section. Each indentation includes angled surfaces that are formed on the two adjacent pins. Other types of elongated products may also be fed into machines for further manufacturing.

One prior art feed mechanism includes a block having a track formed therethrough containing and guiding a strip of pins. A feed pawl is pivotally attached within a cutout in the block by means of a pivot pin. The feed pawl is urged by a spring to pivot clockwise so that a point engages an indentation of the strip. As the block is moved in the feed direction, the point is pressed firmly into the indentation forcing the strip against the opposite wall of the track so that the strip must move along with the block. After the end of the feed stroke is reached, the strip is held in place while the block is moved in the return direction. This movement requires that the point cam out of the indentation and ride along the outer surface of the pin until the point reaches the next upper indentation, when the feeding process can be repeated.

A potential problem arises in that, as the point of the feed pawl rides along the surface of the pin the pawl may scratch or otherwise mar the pin. Another potential problem with this prior art mechanism is that the block necessarily moves through a fixed distance during the feed and return strokes. In the event that the longitudinal spacing of the indentations varies or is slightly different than the fixed movement of the block, the amount of the variation can accumulate to the point where the variation exceeds the length of the indentation. This occurs because at the top of each return stroke, the point engages the angled surface wherever the point is positioned and then will feed the strip from that position a fixed amount and then will return to a return position, which may be slightly further away than the fixed return stroke anticipates. Each cycle causes the point of the pawl to engage the angled surface further and further away from the center of the indentation. Eventually, the point may no longer engage an indentation and the feed mechanism will malfunction.

Another known feed mechanism, as shown in U.S. Pat. No. 6,405,915, provides a feed mechanism that feeds a strip of elongated products without scratching or marring the outer surface of the product. The machine includes a frame and is arranged for incrementally feeding the strip of products and performing a manufacturing operation therewith. Each two adjacent products are attached at an indentation. The feed mechanism is coupled to the frame of the machine for incrementally feeding the strip of products. The feed mechanism includes a feed track for closely receiving and guiding the strip of products along a first axis, and first and second feed fingers mutually opposed on opposite sides of the first axis. A means is provided for moving the first and second feed fingers toward the first axis until in feeding engagement with the strip of products without gripping the strip of products. However, the actuator used for moving the first and second feed fingers in a direction parallel to the first axis thereby feeding the strip of products along the first axis requires excessive time and skill for set up and consequently is costly.

BRIEF DESCRIPTION OF THE INVENTION

In one embodiment a feed mechanism is provided that includes a feed slide movable between a retracted position and an advanced position. The feed slide is configured to feed a product strip during a feed stroke as the feed slide is moved from the retracted position to the advanced position and the feed slide is movable with respect to the product strip during a return stroke as the feed slide is moved from the advanced position to the retracted position. The feed mechanism also includes feed fingers pivotally coupled to the feed slide at corresponding attachment points. The feed fingers are movable between an engaged position and a released position, wherein the feed fingers are configured to contact the product strip in the engaged position and the feed fingers are configured to be positioned away from the product strip in the released position. The feed fingers are moved to the released position prior to the feed slide moving along the return stroke.

In another embodiment a feed mechanism is provided for feeding a product strip having indentations. The feed mechanism includes a link assembly configured to be driven by an actuator assembly along a cyclic operation stroke of the actuator assembly and feed fingers coupled to the link assembly. The feed fingers are moved by the link assembly. A feed slide is coupled to the feed fingers, and the feed slide is movable by the feed fingers between a retracted position and an advanced position. The feed slide is configured to feed the product strip. The link assembly forces the feed fingers to initially pivot away from the product strip until the feed fingers clear the product strip prior to forcing the feed fingers and the feed slide in a retracting direction to the retracted position.

In a further embodiment, a feed mechanism for feeding a product strip having indentations is provided that includes a base, an actuator assembly attached to the base, and a feed slide coupled to the base and arranged for independent sliding movement along a feed axis. A link assembly is driven by the actuator assembly and a feed finger is attached to the link assembly. The feed finger is pivotally coupled to the feed slide so that the actuator assembly forces the feed finger to rotate prior to driving the feed slide along the feed axis.

DETAILED DESCRIPTION OF THE INVENTION

Figure 1:
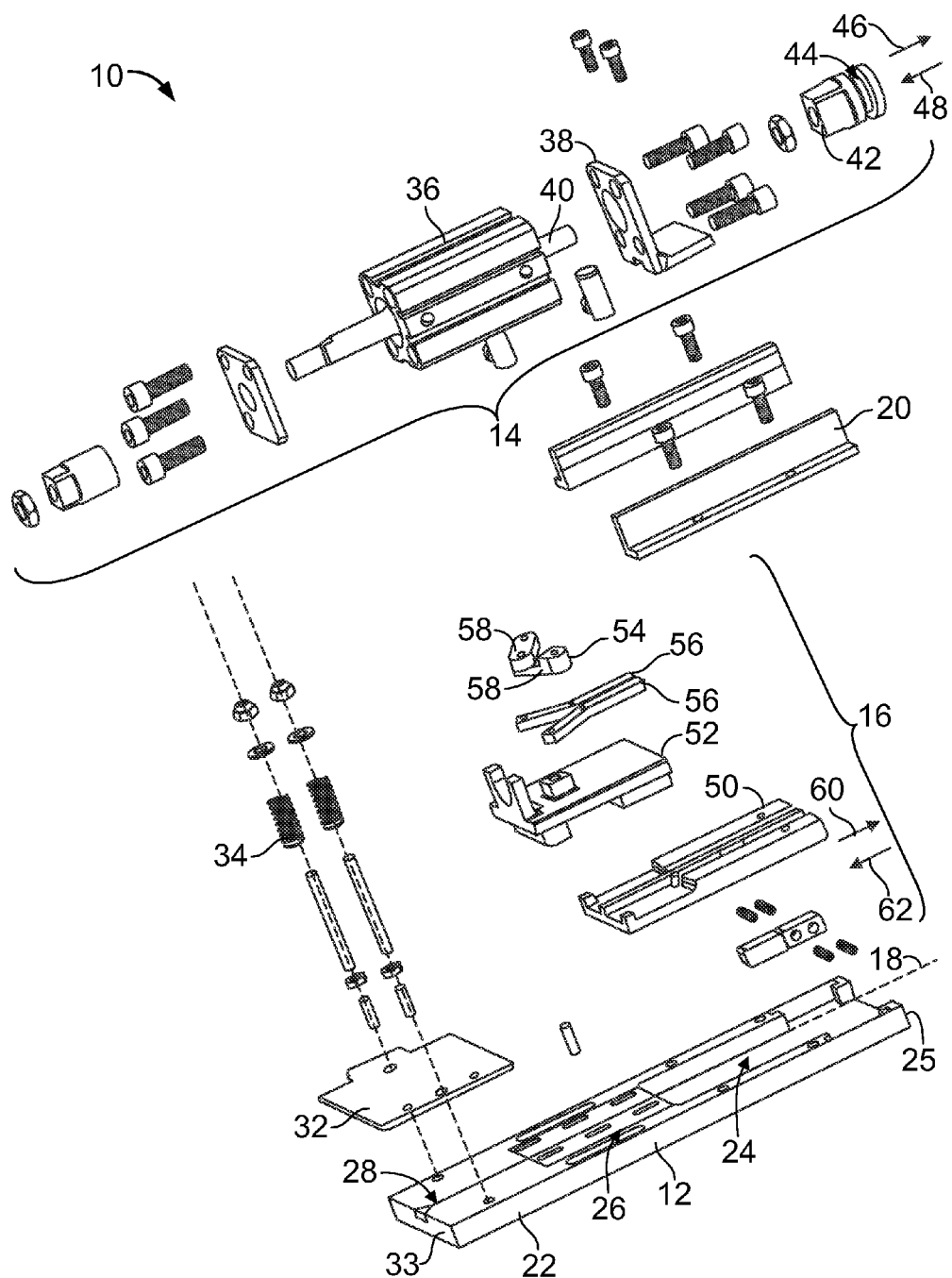
FIG. 1 is an exploded perspective view of a feed mechanism for a machine formed in accordance with an exemplary embodiment.

FIG. 1 is an exploded perspective view of a feed mechanism 10 for a machine (not shown), such as pin insertion machine. In the example of the pin insertion machine, the pin insertion machine receives a strip of mutually attached product or pins for inserting the pins individually into holes of a substrate. The strip is dereeled from a reel in the usual manner. The insertion machine includes a frame and various operational components mounted to the frame. A mounting plate secures the insertion machine to a host machine that directs the placement of the pins in the substrate. The feed mechanism 10 may be attached to, or near, the frame for incrementally feeding the strip of pins into a pin cutoff area where each individual pin is severed from the strip preparatory to its insertion into the substrate. The feed mechanism 10 may be used with other types of machines other than a pin insertion machine in alternative embodiments.

The feed mechanism 10 includes a base 12, an actuator assembly 14 attached to the base 12, and a slide assembly 16 coupled to the base 12 and arranged for independent sliding movement with respect to the base 12 along a feed axis 18. The actuator assembly 14 is operated to move to slide assembly 16. In an exemplary embodiment, a pair of guide brackets 20 are attached to the base 12 to guide the movement of the slide assembly 16.

The base 12 includes a plate 22 having a slide assembly cutout 24 formed therein that receives the slide assembly 16. The slide assembly cutout 24 is positioned near a front 25 of the base 12 such that the slide assembly 16 may be positioned near the front 25 of the base 12. The plate 22 includes slots 26 for attaching the actuator assembly 14 to the base 12. In an exemplary embodiment, the base 12 includes a feed track 28 that receives a product strip 30 (shown in FIG. 2) therein. The product strip 30 is presented to the slide assembly 16 for the feeding operation. A drag plate 32 is attached to the base 12 and is used to provide resistance to hold the product strip 30 in position relative to the base 12. The drag plate 32 is positioned at a rear 33 of the base 12. A pair of compression springs 34 may be used to apply a force on the drag plate 32 toward the base 12 so the drag plate 32 can forcefully engage the product strip 30.

The actuator assembly 14 includes an actuator 36 and a mounting bracket 38 for securing the actuator 36 to the base 12. The actuator 36 includes a piston 40 and a mating element 42 coupled to the end of the piston 40. The mating element 42 is configured to engage the slide assembly 16 to drive the slide assembly 16 along the feed axis 18. In the illustrated embodiment, the mating element 42 includes a circumferential groove 44 for attachment to the slide assembly 16. The mating element 42 may include other types of features in alternative embodiments for attachment to the slide assembly 16. The actuator 36 drives the piston 40 and the mating element 42 through a cyclic operation stroke, which includes driving the piston 40 and mating element 42 linearly in a first direction along a feed stroke 46 and in a second, opposite direction along a return stroke 48. Optionally, the actuator 36 may be pneumatically actuated, however the actuator may be hydraulically actuated, electrically actuated, and the like in alternative embodiments.

The slide assembly 16 includes a feed slide 50 that is received within the slide assembly cutout 24 of the base 12, and the slide assembly includes an actuator attachment assembly 52 that is attached to the actuator assembly 14. The feed slide 50 is arranged for independent sliding movement along the feed axis 18 and the actuator attachment assembly 52 is used to drive the feed slide 50 along the feed axis 18. The guide brackets 20 are attached to the base 12 on either side of the actuator attachment assembly 52 to hold and guide the actuator attachment assembly 52 in a slideable relation with the base 12. The slide assembly 16 also includes a link assembly 54 and feed fingers 56. The feed fingers 56 are pivotally coupled to the feed slide 50 and are configured to engage the product strip 30 for advancing the product strip 30 along the feed axis 18. The link assembly 54 interconnects the actuator attachment assembly 52 and the feed fingers 56. In an exemplary embodiment, the link assembly 54 includes a pair of links 58 that are coupled to one another and to the corresponding feed fingers 56. Optionally, the links 58 may be substantially identically formed.

In operation, when the actuator assembly 14 is activated, the mating element 42 proceeds through the cyclic operation stroke and moves the slide assembly 16 in a first or advancing direction 60 along the feed axis 18 to a first or advanced position. During the return stroke 48 of the operation stroke, the mating element 42 is retracted and moves the slide assembly 16 in a second or retracting direction 62 along the feed axis 18 to a second or retracted position. The drag plate 32 provides pressure on the product strip 30 so that when the slide assembly 16 moves back to the retracted position, the product strip 30 is held and does not move back with the slide assembly 16. As the slide assembly 16 is retracted, the feed fingers 56 are pivoted outward away from the product strip 30 so that the feed fingers 56 do not scratch or otherwise mar the surface of the product strip 30. As the slide assembly 16 is moved from the retracted position to the advanced position, the feed fingers 56 engage the product strip 30 and the product strip 30 is moved in the advancing direction 60.

Figure 2:
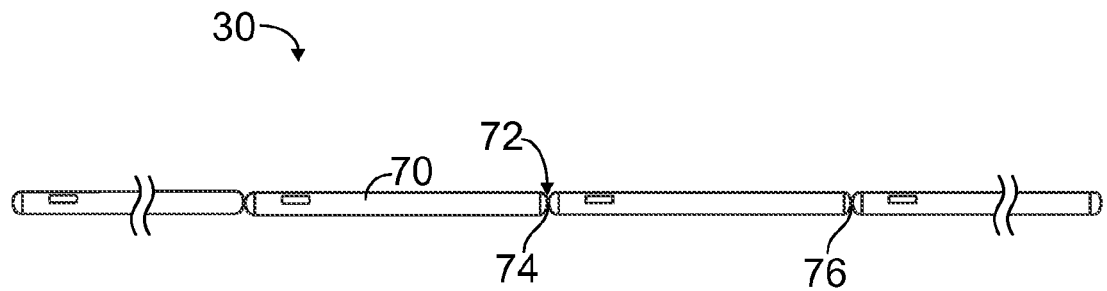
FIG. 2 illustrates a continuous product strip for the feed mechanism shown in FIG. 1.

FIG. 2 illustrates an exemplary continuous product strip 30 for the feed mechanism 10 (shown in FIG. 1). The product strip 30 includes a plurality of individual elongated pins 70, where adjacent pins 70 are interconnected or attached end to end at indentations 72. The product strip 30 is made of square wire so the pins 70 have a square cross-section. Each indentation 72 includes angled surfaces 74, 76 that are formed on the two adjacent pins 70. In an alternative embodiment, rather than square pins, the product strip 30 may include round pins having a round cross-section. Other types of pins, connected end to end, may be provided in alternative embodiments.

Figure 3:
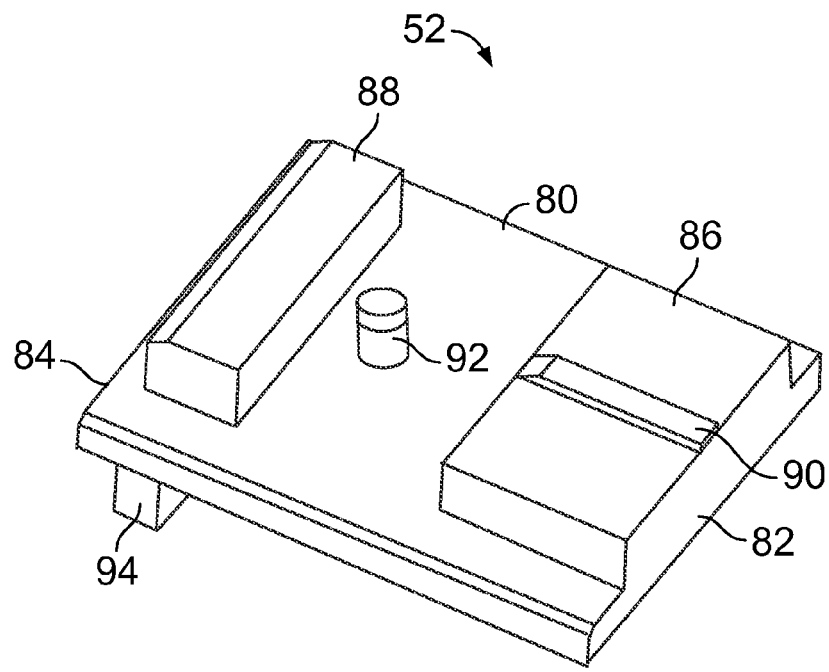
FIG. 3 is a bottom perspective view of an exemplary actuator attachment assembly for the feed mechanism shown in FIG. 1.

FIG. 3 is a bottom perspective view of an exemplary actuator attachment assembly 52 for the feed mechanism 10 (shown in FIG. 1). The actuator attachment assembly 52 includes a plate 80 having a front 82 and a rear 84. Front and rear pads 86, 88 extend from the bottom of the plate 80. Optionally, the front end 86 may include a center rib 90 extending therefrom. The front and rear pads 86, 88 may have substantially similar thicknesses. Optionally, the front pad 86 and the center rib 90 together may have a substantially similar thickness as the rear pad 88.

The actuator attachment assembly 52 includes a dowel pin 92 extending from the bottom of the plate 80. Optionally, the dowel pin 92 may extend through an opening in the plate 80, or alternatively may be integrally formed with the plate 80. The dowel pin 92 is positioned between the front and rear pads 86, 88. Optionally, the dowel pin 92 may be substantially centered between the sides of the plate 80.

In an exemplary embodiment, the actuator attachment assembly 52 includes a clevis portion 94 extending from the top of the plate 80. The clevis portion 94 is configured to engage the actuator assembly 14 (shown in FIG. 1). Other features may be used to provide the connection between the actuator assembly 14 and the actuator attachment assembly 52 other than the clevis portion 94 in alternative embodiments.

Figure 4:
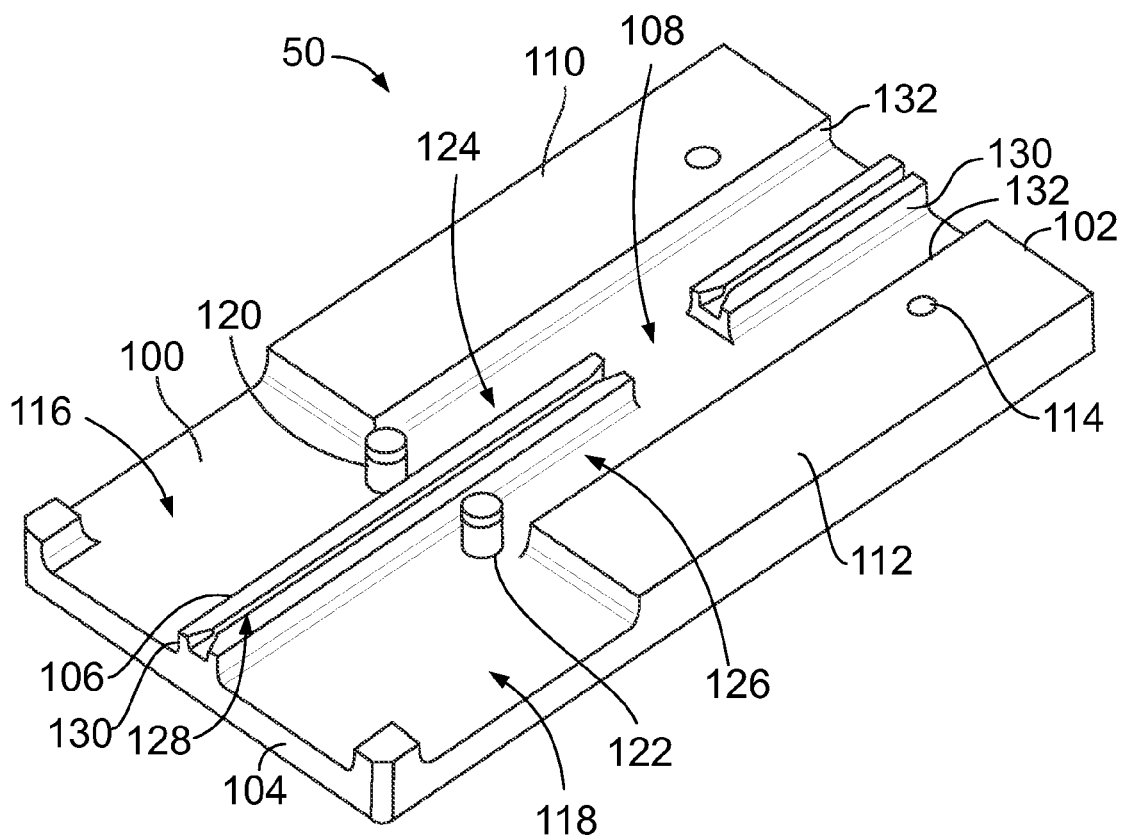
FIG. 4 is a top perspective view of an exemplary feed slide for the feed mechanism shown in FIG. 1.

FIG. 4 is a top perspective view of an exemplary feed slide 50 for the feed mechanism 10 (shown in FIG. 1). The feed slide 50 includes a plate 100 having a front 102 and a rear 104. The feed slide 50 includes a pair of feed tracks 106 extending between the front 102 and the rear 104. An open space 108 is provided between the pair of feed tracks 106. More or less feed track 106 sections may be provided in alternative embodiments. Left and right pads 110, 112 extend from the top of the plate 100 near the front 102. The feed tracks 106 are positioned between, and spaced apart from, each of the left and right pads 110, 112. Mounting holes 114 extend through the left and right pads 110, 112.

Open spaces 116, 118 are provided between the rear 104 and the left and right pads 110, 112, respectively. The spaces 116, 118 are separated from one another by the feed track 106. Projecting pins 120, 122 extend from the top of the plate 100. Optionally, the projecting pins 120, 122 may be provided within or near the open spaces 116, 118. The projecting pins 120, 122 are located proximate to the feed track 106. The projecting pins 120, 122 may be aligned with channels 124, 126 that are formed between the feed tracks 106 and the left and right pads 110, 112, respectively. Optionally, the projecting pins 120, 122 may be integrally formed with the plate 100. Alternatively, the projecting pins 120, 122 may extend through openings in the plate 100. The projecting pins 120, 122 may define attachment points 120, 122 for the feed fingers 56 (shown in FIG. 1).

The feed tracks 106 are elevated from the top of the plate 100. The feed tracks 106 include a groove 128 in the top of the feed track 106 that receives the product strip 30 (shown in FIG. 2). The groove 128 may be chamfered at the entrance and/or exit of the groove 128. The feed tracks 106 have walls 130 that face the open spaces 116, 118 and the channels 124, 126. The walls 130 generally face walls 132 of the left and right pads 110, 112. Optionally, the walls 130 may have a substantially similar height as the walls 132 of the left and right pads 110, 112.

Figure 5:
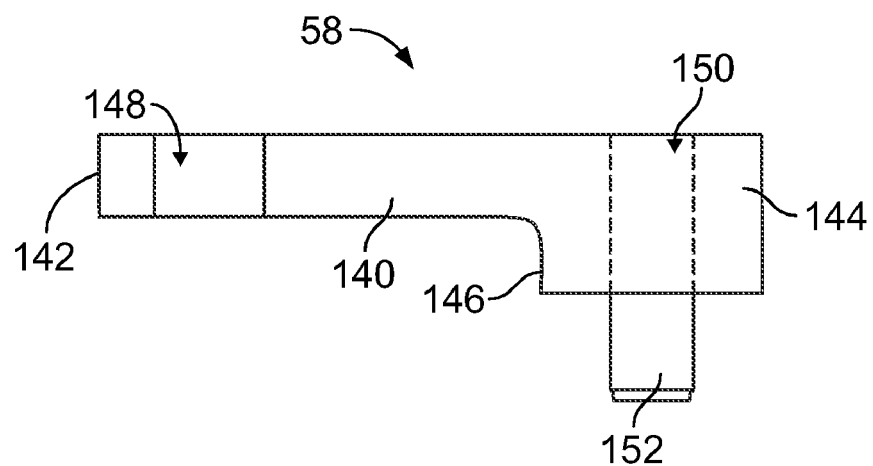
FIG. 5 is a side view of an exemplary link for the feed mechanism shown in FIG. 1.

FIG. 5 is a side view of an exemplary link 58 for the link assembly 54 (shown in FIG. 1). The link 58 includes a beam 140 having a first end 142 and a second end 144. The link 58 includes a stepped portion 146 at the second end 144. The link 58 is thicker at the stepped portion 146.

In an exemplary embodiment, the link 58 includes a first opening 148 extending through the beam 140 proximate to the first end 142. Optionally, the first opening 148 may be generally cylindrical in shape. As will be described in further detail below, the first opening 148 is configured to receive the dowel pin 92 (shown in FIG. 3) when the feed mechanism 10 is assembled.

The link 58 includes a second opening 150 extending through the beam 140 and the stepped portion 146 proximate to the second end 144. A pin 152 is received in the second opening 150. The pin 152 may be received in one of the feed fingers 56 (shown in FIG. 1) to connect the link 58 to the corresponding feed finger 56. Optionally, the pin 152 may be cylindrical to allow rotation of the pin 152 within the second opening 150 and/or within the feed finger 56. In the illustrated embodiment, the pin 152 extends from one side of the link 58 (e.g. the same side from which the stepped portion extends). The pin 152 may extend from the other side of the link 58, or alternatively may extend from both sides of the link 58. The second opening 150 may have a different diameter than the first opening 148. Alternatively, rather than the second opening 150 and the separate pin 152, the link 58 may include an integrally formed pin extending outward from one or both sides of the link 58.

Figure 6:
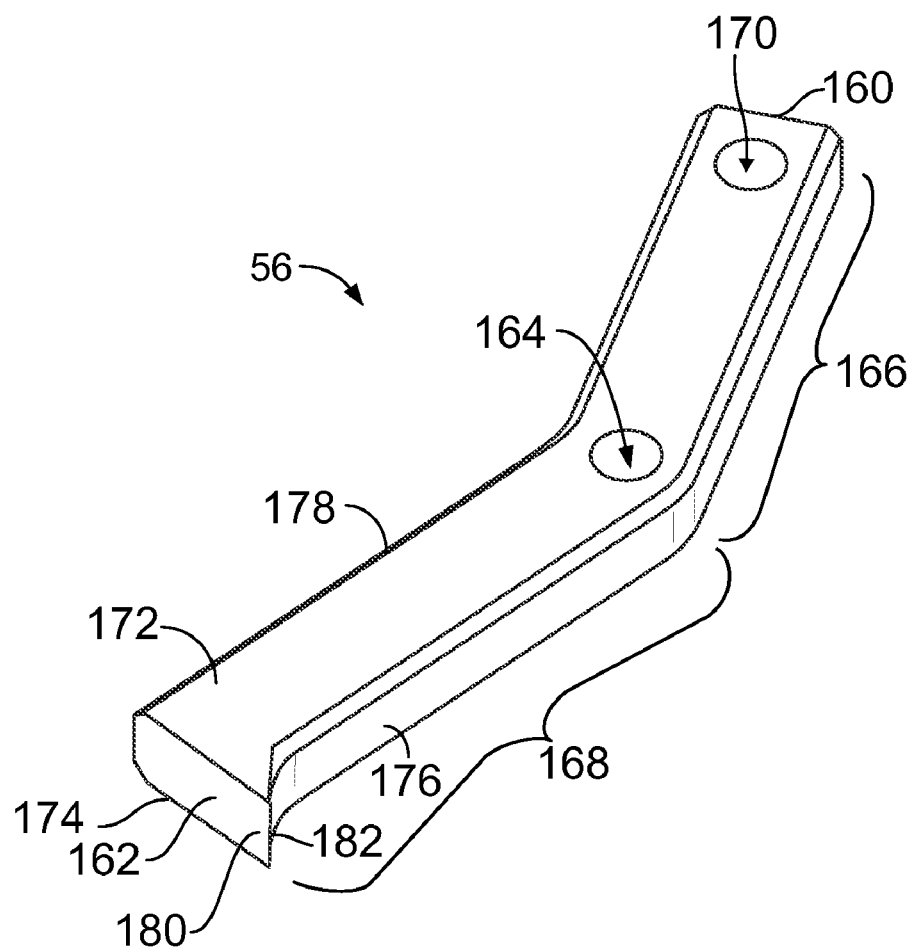
FIG. 6 is a top perspective view of an exemplary feed finger for the feed mechanism shown in FIG. 1.

FIG. 6 is a top perspective view of an exemplary feed finger 56 for the feed mechanism 10 (shown in FIG. 1). The feed finger 56 extends between a first end 160 and the second end 162. The feed finger 56 includes an aperture 164 extending therethrough. The aperture 164 receives one of the projection pins 120, 122 (shown in FIG. 4) when the feed finger 56 is coupled to the feed slide 50 (shown in FIG. 4). As will be described in further detail below, the feed finger 56 is configured to pivot about the corresponding projection pin 120, 122 during operation of the feed mechanism 10.

A first portion 166 of the feed finger 56 is defined between the aperture 164 and the first end 160. A second portion 168 of the feed finger 56 is defined between the aperture 164 and the second end 162. In an exemplary embodiment, the first portion 166 is angled with respect to the second portion 168. The aperture 164 is positioned proximate to the intersection of the first portion 166 in the second portion 168. The feed finger 56 includes a through hole 170 extending through the first portion 166 proximate to the first end 160. The through hole 170 receives the pin 152 (shown in FIG. 5) of the corresponding link 58 (shown in FIG. 5) when the feed finger 56 is coupled to the link 58. Alternatively, rather than the through hole 170 receiving the pin 152, the feed finger 56 may include a pin integrally formed with the feed finger 56 and extending therefrom that is received in the second opening 150 of the link 58.

The feed finger 56 includes a top 172 and a bottom 174. An inner wall 176 extends between the top and bottom 172, 174 along one side of the feed finger 56. An outer wall 178 extends between the top and bottom 172, 174 along the opposite side of the feed finger 56. In an exemplary embodiment, the feed finger includes a contact protrusion 180 extending from the inner wall 176 at the second end 162. The contact protrusion 180 extends to a tip 182. The tip 182 is configured to engage the product strip 30 (shown in FIG. 2) during operation of the feed mechanism 10 to advance the product strip 30.

Figure 7:
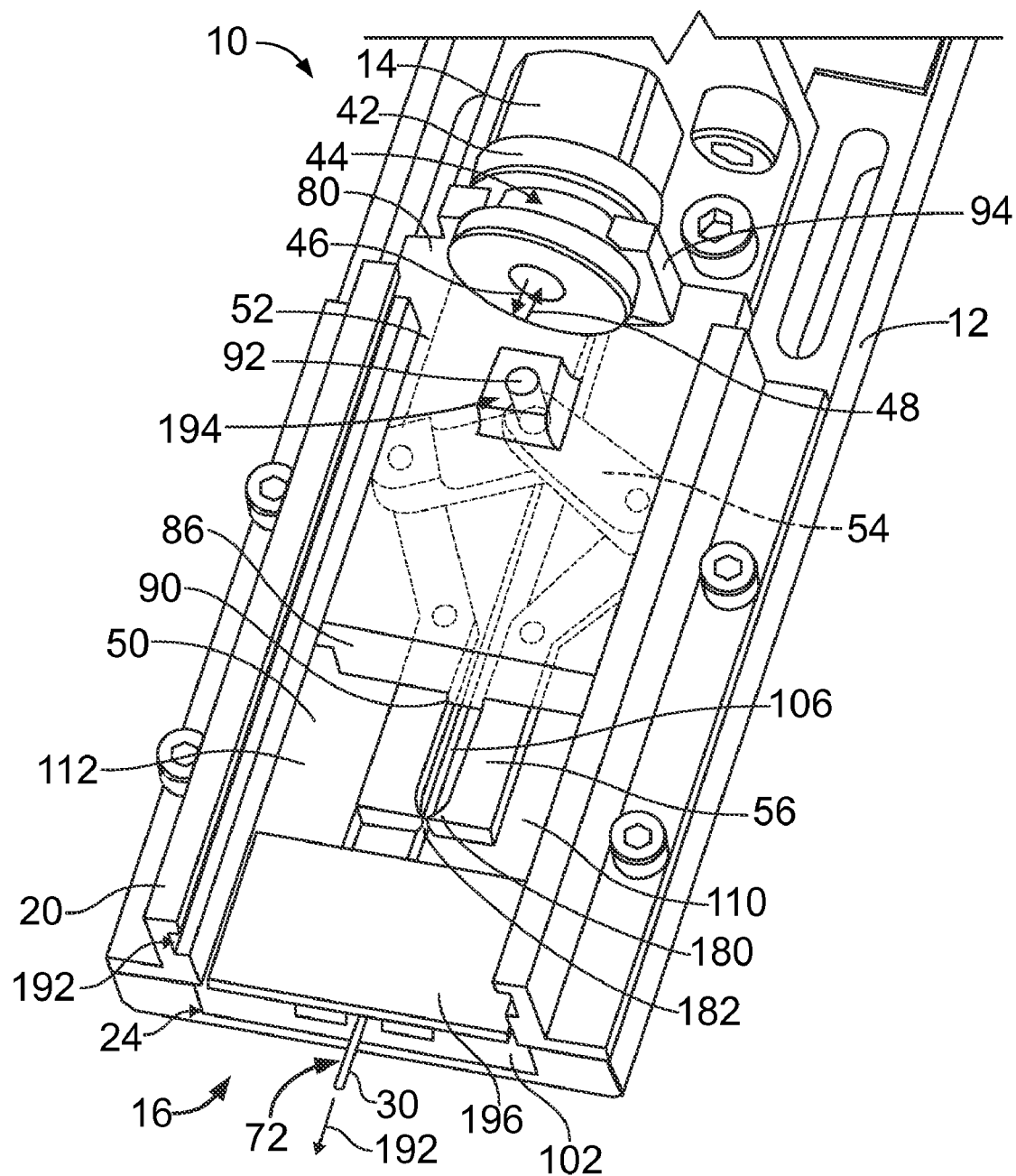
FIG. 7 is an assembled perspective view of a portion of the feed mechanism shown in FIG. 1.

FIG. 7 is an assembled perspective view of the feed mechanism 10 illustrating a portion of the actuator assembly 14 and the slide assembly 16 coupled to the base 12. The feed slide 50 is received within the slide assembly cutout 24. The actuator attachment assembly 52 is positioned on top of the feed slide 50 and the side edges of the plate 80 are received within rails 190 of the guide brackets 20. The clevis portion 94 of the actuator attachment assembly 52 is received within the groove 44 of the mating element 42, which connects the slide assembly 16 to the actuator assembly 14. Other attachment means or components may be used in alternative embodiments to connect the slide assembly 16 to the actuator assembly 14 rather than a U-shaped clevis portion. During operation, as the actuator 36 is actuated along the feed stroke 46 and the return stroke 48, the actuator attachment assembly 52 is slid longitudinally along the guide brackets 20. The guide brackets 20 limit the movement of the actuator attachment assembly 52 to linear movement. As the actuator attachment assembly 52 is moved, the feed slide 50 is also moved to advance the product strip 30 in a feed direction 192 to other areas or components of the machine.

In an exemplary embodiment, the actuator attachment assembly 52 is connected to the feed slide 50 via the link assembly 54 (shown in phantom) and the feed fingers 56. The actuator attachment assembly 52 is connected to the link assembly 54 by the dowel pin 92. In the illustrated embodiment, the dowel pin 92 is separately provided from the actuator attachment assembly 52 and extends through an embossment 194 extending from the top of the plate 80. Movement of the actuator attachment assembly 52 is transferred to the link assembly 54 by the dowel pin 92. In an exemplary embodiment, the dowel pin 92 is not connected directly to the feed slide 50, and as such the actuator attachment assembly 52 is movable with respect to the feed slide 50. The actuator attachment assembly 52 may rest upon and/or be supported by at least a portion of the feed slide 50. Optionally, the actuator attachment assembly 52 may slide along a portion of the feed slide 50 during operation of the feed mechanism 10. In the illustrated embodiment, the center rib 90 contacts the feed track 106 of the feed slide 50. The center rib 90 may cover the product strip 30 to help retain the product strip 30 in the feed track 106. Optionally, the front pad 86 may rest upon the left and right pads 110, 112 of the feed slide 50.

A retention plate 196 is coupled to the front 102 of the feed slide 50. The retention plate 196 extends over the feed track 106. The retention plate 196 may help retain the product strip 30 in the feed track 106. The retention plate 196 may help resist buckling of the product strip 30.

In the illustrated embodiment, the contact protrusions 180 of the feed fingers 56 are aligned with one of the indentations 72 of the product strip 30. The tips 182 of the contact protrusions 180 extend at least partially into the indentation 72 to engage the product strip 30. Activation of the actuator assembly 14 may cause the feed fingers 56 to advance in the feed direction 192 to feed the product strip 30 in the feed direction 192.

Figure 8:
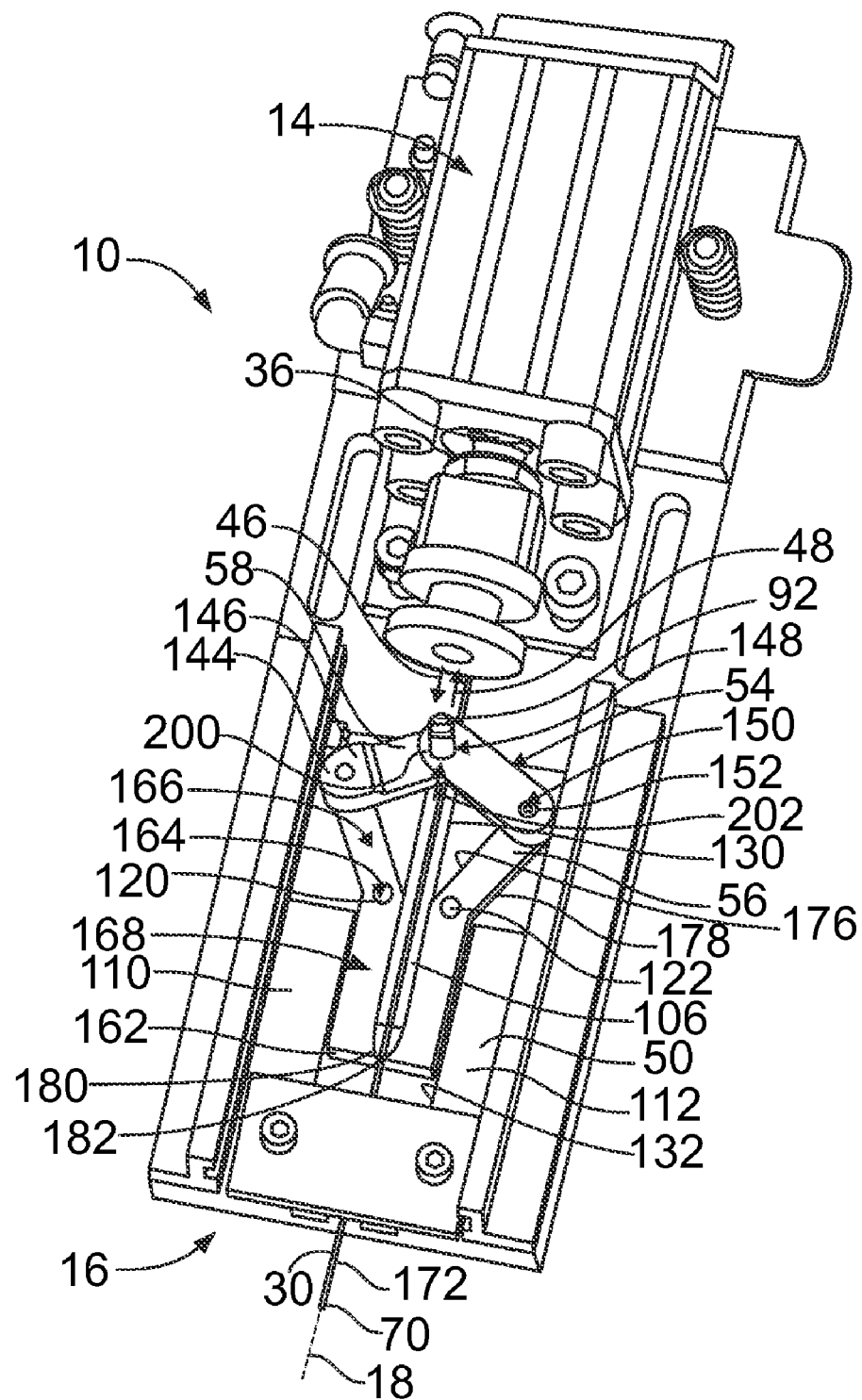
FIG. 8 is a perspective view of the feed mechanism shown in FIG. 7 with the actuator attachment assembly removed and with the feed mechanism in a retracted position.

FIG. 8 is a perspective view of the feed mechanism 10 with the actuator attachment assembly 52 (shown in FIG. 7) removed and with the feed slide 50 in a retracted position. FIG. 8 illustrates the link assembly 54 and the feed fingers 56 coupled to the feed slide 50. The feed fingers 56 are coupled to the feed slide 50 via the projection pins 120, 122. For example, the projection pins 120, 122 extend through the apertures 164. The relative position of the feed fingers 56 with respect to the feed slide 50 are fixed at the attachment point defined by the projection pins 120, 122. However, the first and second portions 166, 168 may be moved relative to the feed slide 50 because the feed fingers 56 may be rotated about the projection pins 120, 122. Rotation of the feed fingers 56 allows the contact protrusions 180 to be moved towards and away from the product strip 30. In the illustrated embodiment, the feed fingers 56 are in an engaged position, in which the feed fingers 56 engage, or are capable of engaging, the product strip 30. For example, the contact protrusions 180 are located within the indentation 72 such that the tips 182 are inside of the perimeter defined by the cross-section of the pins 70. As such, movement of the feed fingers 56 along the feed axis 18 causes the feed fingers 56 to engage one of the angle surfaces 74 (shown in FIG. 2) defining the indentation 72 to advance the product strip 30 along the feed axis 18.

The links 58 of the link assembly 54 are connected to one another by the dowel pin 92 and extends through the plate 80 (shown in FIG. 3) of the actuator attachment assembly 52. For example, the dowel pin 92 extends through the first openings 148 in both links 58. Both links 58 may be rotated about the dowel pin 92. In an exemplary embodiment, the links 58 are mounted in different directions, wherein one of the links 58 is coupled to the dowel pin 92 such that the stepped portion 146 faces toward the feed slide 50 while the other link 58 is coupled to the dowel pin 92 such that the stepped portion 146 faces away from the feed slide 50.

The feed fingers 56 are coupled to the links 58 via the pins 152 that extend into the second openings 150 of the links 58 and into the through holes 170 (shown in FIG. 6) of the feed fingers 56. The pins 152 allow the links 58 and the feed fingers 56 to rotate with respect to one another.

In operation, the actuator 36 is movable along the feed stroke 46 and the return stroke 48. The movement of the actuator 36 is transferred to the link assembly 54 by the actuator attachment assembly 52 and the dowel pin 92. For example, when the actuator 36 is moved along the feed stroke 46, the dowel pin 92 is forced in an advancing direction 200 and when the actuator 36 is moved along the return stroke 48 the dowel pin 92 is forced in a retracting direction 202. As described above, because the link assembly 54 and the feed fingers 56 may be rotated with respect to one another, movement of the link assembly 54 causes the feed fingers 56 to rotate. For example, as the dowel pin 92 moves in the advancing direction 200 the ends 144 of the links 58 are forced outward and away from each other. As the ends 144 of the links 58 are forced outward, the first ends 160 (shown in FIG. 6) of the feed fingers 56 are likewise forced outward and away from each other. At the same time, the feed fingers 56 are rotated about the projection pins 120, 122 such that the second ends 162 of the feed fingers 56 are forced inward and towards each other and the product strip 30.

In operation, when the actuator 36 is moved along the return stroke 48, the dowel pin 92 is forced in the retracting direction 202. As the dowel pin 92 moves in the retracting direction 202, the ends 144 of the links 58 are forced inward and towards each other. As the ends 144 of the links 58 are forced inward, the first ends 160 of the feed fingers 56 are likewise forced inward and towards each other. At the same time, the feed fingers 56 are rotated about the projection pins 120, 122 such that the second ends 162 of the feed fingers 56 are forced outward and away from each other and the product strip 30.

In an exemplary embodiment, the range of motion of the feed fingers 56 may be controlled to limit the amount of pivoting or rotating of the feed fingers 56. For example, the walls 176, 178 of the feed fingers 56 may engage the feed slide walls 130, 132, respectively. During the feed stroke 46, the feed fingers 56 bottom against the feed track 106 to limit pivoting of the feed fingers 56. Similarly, during the return stroke 48, the feed fingers 56 bottom against the right and left pads 110, 112 to limit pivoting of the feed fingers 56. Once further pivoting of the feed fingers 56 is restricted, movement of the actuator 36 may be transferred directly to the feed slide 50. For example, during the feed stroke 46, advancing movement of the actuator 36 is transferred by the actuator attachment assembly 52 to the dowel pin 92, to the link assembly 54, to the feed fingers 56, and then to the feed slide 50. As such, all the components of the slide assembly 16 may be advanced together in the advancing direction 200 once the feed fingers 56 are biased against the feed track 106. Similarly, all the components of slide assembly 16 may be retracted together in the retracting direction 202 once the feed fingers 56 are biased against the right and left pads 110, 112.

Figure 9:
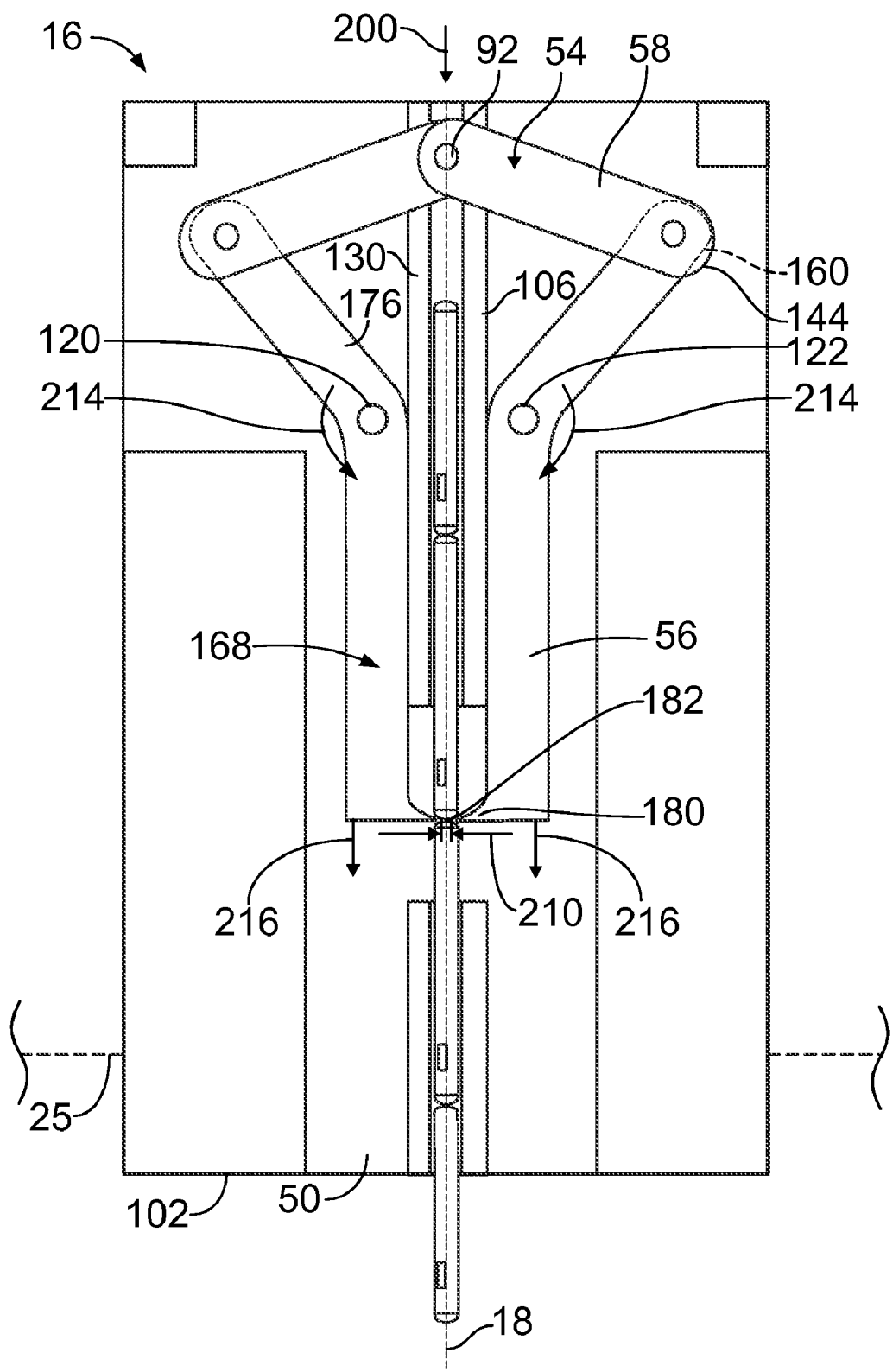
FIG. 9 is a top view of the feed mechanism shown in FIG. 7 with the actuator attachment assembly removed and with the feed mechanism in an advanced position.

FIG. 9 is a perspective view of a portion of the feed mechanism 10 (shown in FIG. 1) with the actuator attachment assembly 52 removed and with the slide assembly 16 in an advanced position. In the advanced position, the front 102 of the feed slide 50 is advanced beyond the front 25 of the base 12 (shown in FIG. 1), although the front 102 of the feed slide 50 need not be positioned beyond the front 25 of the base 12 in other embodiments. As such, the product strip 30 is similarly advanced forwardly with respect to the front 25 of the base 12.

The feed fingers 56 are illustrated in an engaged position, in which the feed fingers 56 engage, or are capable of engaging, the product strip 30. For example, the contact protrusions 180 are separated by a distance 210 that is less than a thickness 212 of the product strip 30. The tips 182 are located within the indentation 72 to engage one of the angle surfaces 74 (shown in FIG. 2) defining the indentation 72 to advance the product strip 30 along the feed axis 18. In the engaged position, the inner walls 176 of the feed fingers 56 engage the walls 130 defining the feed track 106. As such, the feed track walls 130 define inner stop walls, and may be referred to hereinafter as inner stop walls 130. The inner stop walls 130 define a pivot stop for the feed fingers 56 that restricts movement of the second portions 168 of the feed fingers 56 towards one another. The inner stop walls 130 may define the distance 210 to stop the tips 182 of the contact protrusions 180 from pinching too close to one another, which could damage the product strip 30, such as by shearing adjacent pins 70 apart.

The feed fingers 56 are transferred to the engaged position by the links 58 of the link assembly 54. For example, when the dowel pin 92 is pushed forward in the advancing direction 200 by the actuator attachment assembly 52 and the actuator 36 (shown in FIG. 1), the ends 144 of the links 58 are forced outward and away from each other. At the same time, the first ends 160 of the feed fingers 56 are likewise forced outward and the feed fingers 56 are rotated about the projection pins 120, 122 until the inner walls 176 engage the inner stop walls 130. As such, a portion of the linear transfer motion of the actuator attachment assembly 52 and the actuator 36 in the advancing direction 200 is converted by the link assembly 54 into rotational movement of the feed fingers 56. However, once the feed fingers 56 are in the engaged position, the feed fingers 56 are no longer rotated, but rather the linear transfer motion of the actuator attachment assembly 52 and the actuator 36 in the advancing direction 200 is transferred by the link assembly 54 and the feed fingers 56 into linear movement of the feed slide 50. For example, because the feed fingers 56 are attached to the feed slide 50 by the projection pins 120, 122, the linear movement of the feed fingers 56 corresponds directly to linear movement of the feed slide 50. During the feed stroke 46 (shown in FIG. 1) of the actuator assembly 14 (shown in FIG. 1), the feed fingers 56 have two different types of movement, one being a rotational movement in a first rotational direction 214 and the other being a linear movement in a first linear direction 216. Both types of movement result directly from the linear movement of the actuator attachment assembly 52 and the actuator 36 in the advancing direction 200. In an exemplary embodiment, the rotational movement in the first rotational direction 214 occurs prior to the linear movement in the first linear direction 216.

Figure 10:
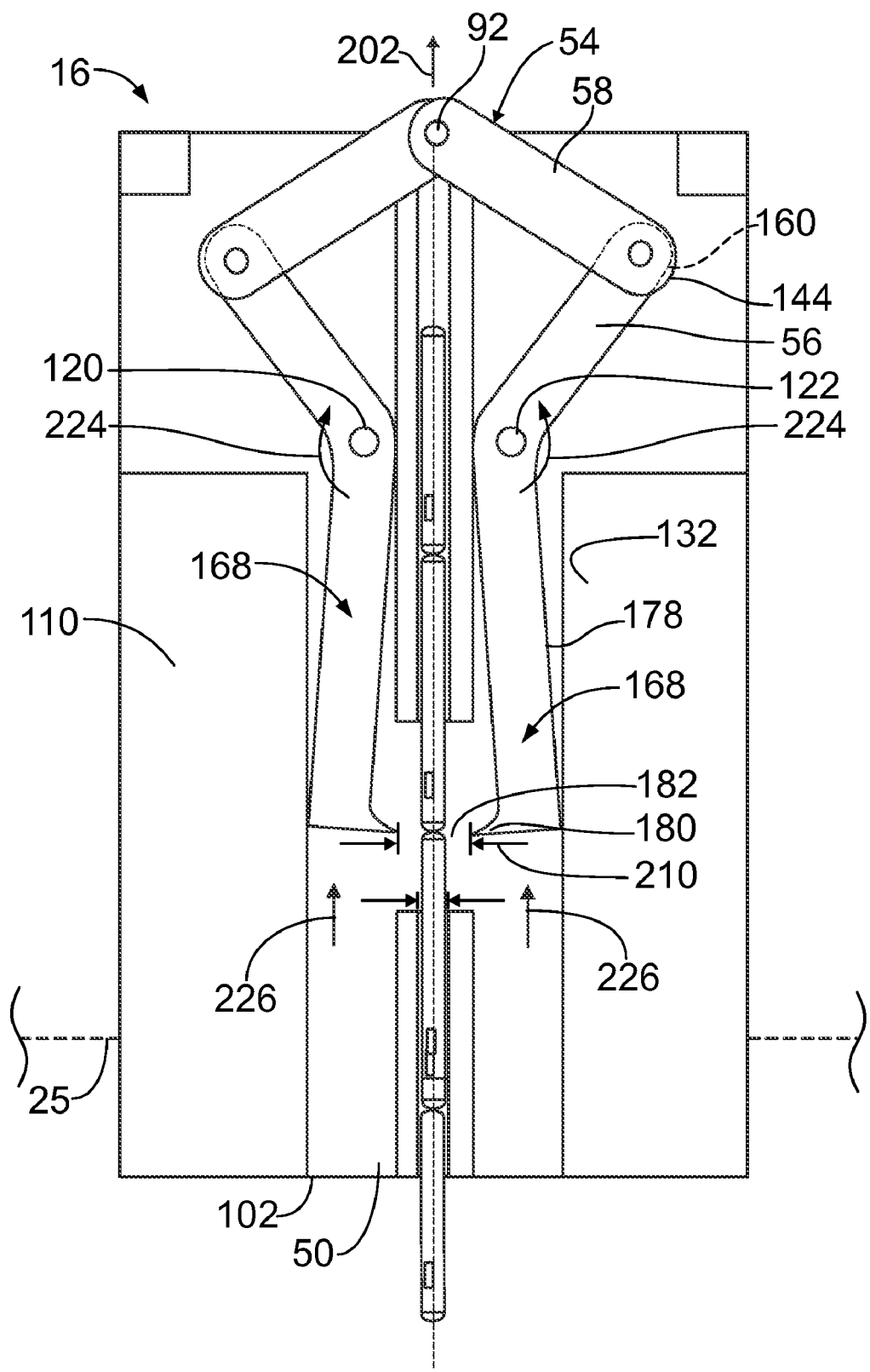
FIG. 10 is a top view of a portion of the feed mechanism shown in FIG. 1 with the feed fingers being retracted.

FIG. 10 is a perspective view of a portion of the feed mechanism 10 (shown in FIG. 1) with the actuator attachment assembly 52 removed and with the slide assembly 16 in a retracted position. In the retracted position, the front 102 of the feed slide 50 is substantially aligned with the front 25 of the base 12 (shown in FIG. 1), although the front 102 of the feed slide 50 need not be aligned with the front 25 of the base 12 in other embodiments. The feed slide 50 is moved rearward in the retracting direction 202 from the advanced position (such as the position shown in FIG. 9) to the retracted position without moving the product strip 30 in a similar direction. Rather, the product strip 30 remains stationary while the feed slide 50 moves rearward, such as with the help of the drag plate 32 (shown in FIG. 1).

The feed fingers 56 are illustrated in a released position, in which the feed fingers 56 are positioned away from, and do not engage, the product strip 30. For example, the contact protrusions 180 are separated by a distance 220 that is greater than the thickness 212 of the product strip 30. The feed fingers 56 are moved from the engaged position (shown on FIG. 9) to the released position prior to the feed slide 50 moving from the advanced position to the retracted position. As such, the feed fingers 56 do not engage the product strip 30 as the feed slide 50 is moved from the advanced position to the retracted position. The contact protrusions 180 thus do not scrape or mar the outer surface of the pins 70 (shown in FIG. 2).

In the released position, the outer walls 178 of the feed fingers 56 engage the walls 132 defining the left and right pads 110, 112. As such, the pad walls 132 define outer stop walls, and may be referred to hereinafter as outer stop walls 132. The outer stop walls 132 define a pivot stop for the feed fingers 56 that restricts movement of the second portions 168 of the feed fingers 56 away from one another. The outer stop walls 132 are separated from one another by a sufficient distance to allow the feed fingers 56 to rotate away from one another to provide clearance between the tips 182 of the contact protrusions 180 and the product strip 30.

The feed fingers 56 are transferred to the released position by the links 58 of the link assembly 54. For example, when the dowel pin 92 is forced rearward in the retracting direction 202 by the actuator attachment assembly 52 and the actuator 36 (shown in FIG. 1), the ends 144 of the links 58 are forced inward and towards each other. At the same time, the first ends 160 of the feed fingers 56 are likewise forced inward and the feed fingers 56 are rotated about the projection pins 120, 122 until the outer walls 178 engage the outer stop walls 132. As such, a portion of the linear transfer motion of the actuator attachment assembly 52 and the actuator 36 in the retracting direction 202 is converted by the link assembly 54 into rotational movement of the feed fingers 56. However, once the feed fingers 56 are in the released position, the feed fingers 56 are no longer rotated, but rather the linear transfer motion of the actuator attachment assembly 52 and the actuator 36 in the retracting direction 202 is transferred by the link assembly 54 and the feed fingers 56 into linear movement of the feed slide 50. For example, because the feed fingers 56 are attached to the feed slide 50 by the projection pins 120, 122, the linear movement of the feed fingers 56 corresponds directly to linear movement of the feed slide 50. The force imparted on the feed fingers 56 by the link assembly 54 during the return stroke 48 initially cause the feed fingers 56 to pivot from the engaged position to the released position before the feed fingers 56 and the feed slide 50 are moved in the retracting direction 202.

During the return stroke 48 (shown in FIG. 1) of the actuator assembly 14 (shown in FIG. 1), the feed fingers 56 have two different types of movement, one being a rotational movement in a second rotational direction 224 and the other being a linear movement in a second linear direction 226. Both types of movement result directly from the linear movement of the actuator attachment assembly 52 and the actuator 36 in the retracting direction 202. In an exemplary embodiment, the rotational movement in the second rotational direction 224 occurs prior to the linear movement in the second linear direction 226. The feed fingers 56 may remain in the released position with the contact protrusions 180 positioned away from the product strip 30 during the entire return stroke 48.

In the retracted position, the contact protrusions 180 are again aligned with one of the indentation 72 and the product strip 30. As such, when the feed fingers 56 are moved to the engaged position, the contact protrusions 180 are brought into the indentation 72 to engage the product strip 30. Once in the retracted position, the cyclic operation stroke of the actuator assembly 14 continues with another feed stroke 46 of the actuator 36, which again forces the feed fingers 56 to the engaged position and then forces the feed slide 50 to the advanced position. The force imparted on the feed fingers 56 via the link assembly 54 during the feed stroke 46 initially causes the feed fingers 56 to pivot from the released position to the engaged position before the feed fingers 56 and the feed slide 50 are moved in the advancing direction 200.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A feed mechanism comprising:
    a feed slide movable between a retracted position and an advanced position, the feed slide having a plate and a feed track extending from the plate, the feed track having a groove extending in a first direction that receives a continuous product strip, the feed track includes inner stop walls extending parallel to the groove and the continuous product strip, the feed slide being configured to feed the product strip during a feed stroke as the feed slide is moved in the first direction from the retracted position to the advanced position and the feed slide is movable with respect to the product strip during a return stroke as the feed slide is moved from the advanced position to the retracted position; and
    feed fingers pivotally coupled to the feed slide on opposite sides of the feed track at corresponding attachment points, the feed fingers being movable between an engaged position and a released position, wherein the feed fingers are configured to contact the product strip in the engaged position and the feed fingers are configured to be positioned away from the product strip in the released position, wherein the feed fingers are moved to the released position prior to the feed slide moving along the return stroke, and wherein the feed fingers engage the inner stop walls to limit pivoting of the feed fingers towards the product strip.

2. The feed mechanism of claim 1, wherein the feed fingers are positioned away from, and are moved along, the product strip during the entire return stroke.

3. The feed mechanism of claim 1, wherein the product strip has a plurality of indentations, the feed fingers engage the portion of the product strip defining the corresponding indentation when the feed fingers are in the engaged position, the feed fingers being in the released position when aligned with the portion of the product strip between the indentations.

4. The feed mechanism of claim 1, wherein the feed fingers include contact protrusions aligned with one another and extending towards one another, the contact protrusions engage the product strip when the feed fingers are in the engaged position, the contact protrusions are pivoted away from one another when the feed fingers are moved to the released position, the contact protrusions being separated by a distance greater than a thickness of the product strip when the feed fingers are in the released position.

5. The feed mechanism of claim 1, wherein the feed slide includes outer stop walls that limit pivoting of the feed fingers away from the product strip.

6. The feed mechanism of claim 1, wherein the feed fingers are forced in the first direction to move the feed slide along the feed stroke, and the feed fingers are forced in an opposite second direction to move the feed slide along the return stroke.

7. The feed mechanism of claim 6, wherein the force imparted on the feed fingers in the first direction initially causes the feed fingers to pivot to the engaged position before the feed fingers and the feed slide are moved along the feed stroke, and wherein the force imparted on the feed fingers in the second direction initially causes the feed fingers to pivot to the released position before the feed fingers and the feed slide are moved along the return stroke.

8. The feed mechanism of claim 1, wherein the feed fingers move along the feed stroke and the return stroke with the feed slide, the continuous product strip being advanced with the feed fingers and feed slide during the feed stroke, the continuous product strip remaining in place with the feed fingers and feed slide moving relative to the continuous product strip during the return stroke.

9. The feed mechanism of claim 1, further comprising:
    a link assembly configured to be driven by an actuator assembly along a cyclic operation stroke of the actuator assembly;
    the feed fingers being coupled to the link assembly, the feed fingers being moved by the link assembly.

10. The feed mechanism of claim 9, wherein the link assembly forces the feed fingers to initially pivot toward the product strip until contact protrusions of the feed fingers are axially aligned with the indentations prior to forcing the feed fingers and the feed slide in an advancing direction to the advanced position.

11. The feed mechanism of claim 9, wherein the link assembly includes two links joined at ends thereof by a pin, each link is attached at an opposite end to a corresponding feed finger, the links rotate about the pin.

12. The feed mechanism of claim 9, wherein the link assembly forces the feed fingers to rotate and to move linearly as the link assembly is driven by the actuator assembly.

13. The feed mechanism of claim 9, wherein, during one cycle of the cyclic operation stroke, the link assembly forces the feed fingers to rotate in a first rotational direction, to move linearly in a first linear direction, to rotate in a second rotational direction, and to move linearly in a second linear direction.

14. The feed mechanism of claim 9, wherein each feed finger includes an aperture that receives a pin extending from the feed slide, the feed finger being pivotal about the pin, each feed finger includes a first portion extending from the aperture to a first end, the feed finger coupled to the link assembly at the first end, each feed finger includes a second portion extending from the aperture to a second end, the feed finger engages the product strip at the second end, the first portion being angled with respect to the second portion.

15. The feed mechanism of claim 14, wherein the link assembly is driven generally along a feed axis by the actuator assembly, the first portion being angled with respect to the feed axis such that the first end is offset with respect to the pin, the force imparted on the feed finger by the link assembly forces the feed finger to rotate about the pin.

16. The feed mechanism of claim 9, wherein the feed slide includes outer stop walls that limit pivoting of the feed fingers away from the product strip, the inner and outer stop walls extending along the first direction.

17. The feed mechanism of claim 1, wherein the plate includes a front and a rear, the plate having opposite sides, the plate defining an envelope defined by the front, rear and sides, the feed fingers being contained within the envelope.

18. The feed mechanism of claim 1, wherein the feed track includes a front feed track portion and a rear feed track portion with a gap therebetween, the continuous product strip spanning the gap and being held in the groove in both the front and rear feed tracks, the feed fingers engaging the product strip in the gap between the front and the rear feed tracks.

19. The feed mechanism of claim 1, wherein the continuous product strip extends along a central axis, the groove extending parallel to the central axis of the continuous product strip and the continuous product strip being fed along a feed axis parallel to the central axis of the continuous product strip.

* * * * *